(12) United States Patent
Horan et al.

(10) Patent No.: US 10,437,671 B2
(45) Date of Patent: Oct. 8, 2019

(54) SYNCHRONIZING REPLICATED STORED DATA

(71) Applicant: International Business Machines Corporation, Armonk, NY (US)

(72) Inventors: Scott M. Horan, Clarendon Hills, IL (US); Ravi V. Khadiwala, Bartlett, IL (US); Greg R. Dhuse, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 164 days.

(21) Appl. No.: 15/164,357

(22) Filed: May 25, 2016

(65) Prior Publication Data
US 2017/0004055 A1 Jan. 5, 2017

Related U.S. Application Data

(60) Provisional application No. 62/186,590, filed on Jun. 30, 2015.

(51) Int. Cl.
*G06F 11/00* (2006.01)
*G06F 11/10* (2006.01)
(Continued)

(52) U.S. Cl.
CPC .......... *G06F 11/1076* (2013.01); *G06F 3/064* (2013.01); *G06F 3/065* (2013.01);
(Continued)

(58) Field of Classification Search
CPC ............ G06F 11/1076; G06F 11/1662; G06F 3/0619; G06F 17/30312; H03M 13/33;
(Continued)

(56) References Cited

U.S. PATENT DOCUMENTS 4,092,732 A  5/1978  Ouchi
5,454,101 A  9/1995  Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Philip Guyton
(74) *Attorney, Agent, or Firm* — Garlick & Markison; Timothy W. Markison; Kelly H. Hale

(57) ABSTRACT

A method begins by a processing module initiating storage of a data object in two or more storage sets. The method continues with the processing module updating synchronization status for the two or more storage sets when detecting failure to store at least a minimum number of encoded data slices to enable recovery from one of the storage sets. The method continues with the processing module determining to resynchronize the two or more storage sets. The method continues with the processing module identifying a data object requiring resynchronization. The method continues with the processing module identifying a latest available revision associated with the data object and facilitating storage of the identified latest available revision of the data object in at least one storage set requiring the latest revision to satisfy the resynchronization.

20 Claims, 6 Drawing Sheets

(51) Int. Cl.
| | |
|---|---|
| *G06F 3/06* | (2006.01) |
| *G06F 16/22* | (2019.01) |
| *G06F 16/27* | (2019.01) |
| *G06F 16/2458* | (2019.01) |
| *G06F 16/2457* | (2019.01) |
| *G06F 11/16* | (2006.01) |
| *H03M 13/33* | (2006.01) |
| *H04L 29/08* | (2006.01) |
| *H04L 29/06* | (2006.01) |
| *H03M 13/37* | (2006.01) |
| *H03M 13/15* | (2006.01) |

(52) U.S. Cl.
CPC ............ *G06F 3/067* (2013.01); *G06F 3/0619* (2013.01); *G06F 11/1662* (2013.01); *G06F 16/22* (2019.01); *G06F 16/2471* (2019.01); *G06F 16/24578* (2019.01); *G06F 16/27* (2019.01); *G06F 16/273* (2019.01); *H03M 13/33* (2013.01); *H03M 13/3761* (2013.01); *H04L 65/4076* (2013.01); *H04L 67/06* (2013.01); *H04L 67/1095* (2013.01); *H04L 67/1097* (2013.01); *H04L 67/16* (2013.01); *G06F 2201/805* (2013.01); *H03M 13/1515* (2013.01)

(58) Field of Classification Search
CPC ............. H04L 65/4076; H04L 67/1095; H04L 67/1097
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Saran et al. | |
| 2007/0283167 A1 | 12/2007 | Venters, III et al. | |
| 2008/0263113 A1* | 10/2008 | Krishnaiyer | G06F 17/30138 |
| 2009/0094251 A1 | 4/2009 | Gladwin et al. | |
| 2009/0094318 A1* | 4/2009 | Gladwin | H04L 67/1097 709/203 |
| 2010/0023524 A1 | 1/2010 | Gladwin et al. | |
| 2011/0029731 A1* | 2/2011 | Cilfone | G06F 11/1076 711/114 |
| 2011/0060940 A1* | 3/2011 | Taylor | G06F 11/1662 714/4.11 |
| 2012/0166757 A1* | 6/2012 | Volvovski | G06F 17/30 711/206 |
| 2013/0326264 A1* | 12/2013 | Resch | G06F 11/1088 714/6.2 |
| 2016/0070719 A1* | 3/2016 | Resch | G06F 17/30557 707/827 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

(56) References Cited

OTHER PUBLICATIONS

Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner distributed computing system 10

SYNCHRONIZING REPLICATED STORED DATA

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

Technical Field of the Invention

Aspects of this invention relate generally to computer networks and more particularly to dispersed storage of data and distributed task processing of data.

Description of Related Art

Computing devices are known to communicate data, process data, and/or store data. Such computing devices range from wireless smart phones, laptops, tablets, computers (PCs), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

DETAILED DESCRIPTION OF THE INVENTION

Figure 1:
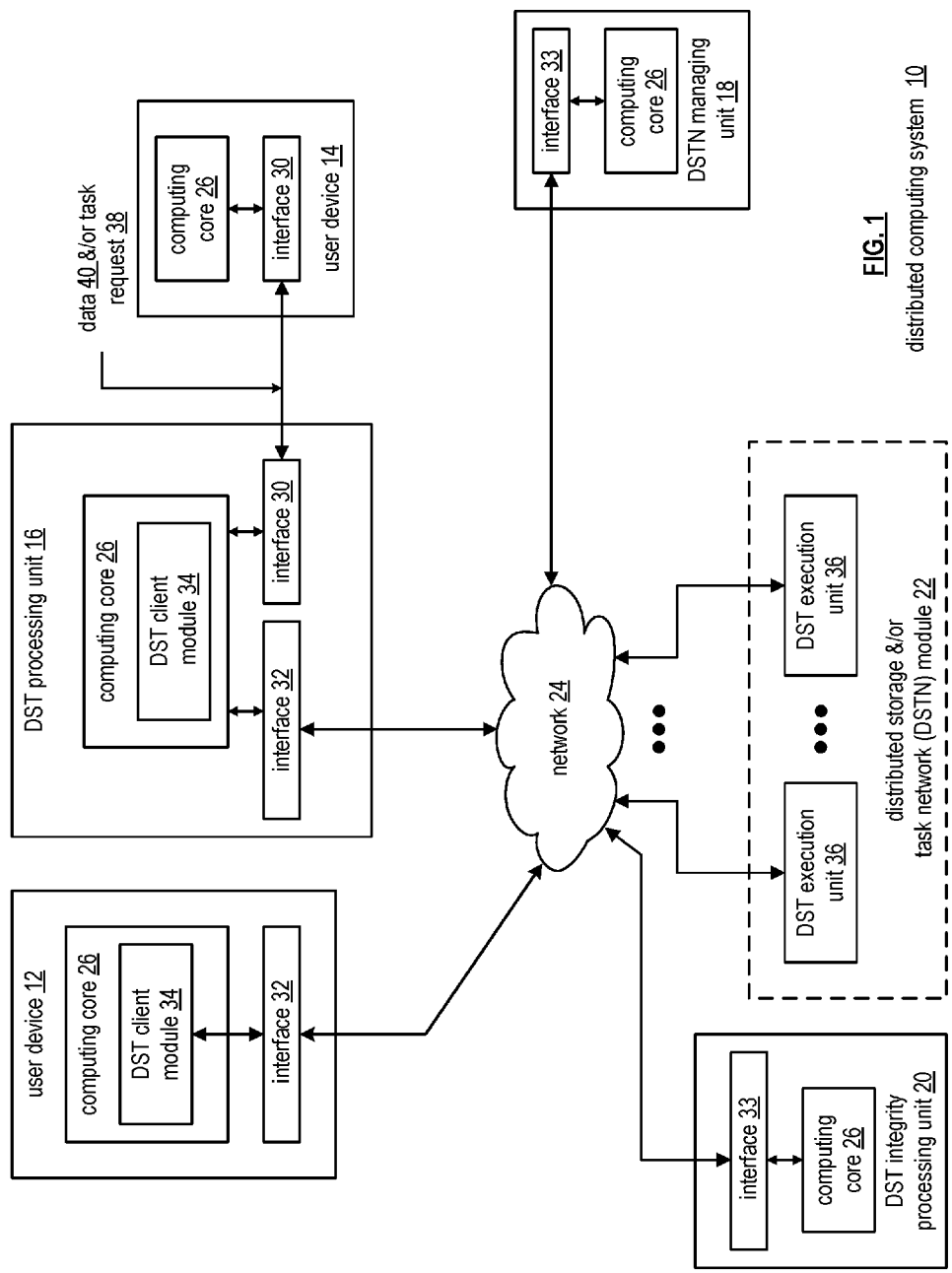
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more non-public intranet systems and/or public interne systems; and/or one or more local area networks (LAN) and/or wide area networks (WAN). Hereafter, the distributed computing system 10 may be interchangeably referred to as a dispersed storage network (DSN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, the DST execution unit may be interchangeably referred to as a storage unit and a set of DST execution units may be interchangeably referred to as a set of storage units.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval, and data storage integrity verification. In accordance with these three primary functions, data can be encoded (e.g., utilizing an information dispersal algorithm (IDA), utilizing a dispersed storage error encoding process), distributedly stored in physically different locations, and subsequently retrieved in a reliable and secure manner. Hereafter, distributedly stored may be interchangeably referred to as dispersed stored. Such a system is tolerant of a significant number of failures (e.g., up to a failure level, which may be greater than or equal to a pillar width (e.g., an IDA width of the IDA) minus a decode threshold minus one) that may result from individual storage device (e.g., DST execution unit 36) failures and/or network equipment failures without loss of data and without the need for a redundant or backup copy. Further, the distributed computing system 10 allows the data to be stored for an indefinite period of time without data loss and does so in a secure manner (e.g., the system is very resistant to unauthorized attempts at accessing the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block associated with a portion of an overall namespace of the DSN) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated system registry information in one or more of the DSTN module 22, the user device 12, the DST processing unit 16, and the DST integrity processing unit 20.

The DS error encoding parameters (e.g., or dispersed storage error coding parameters for encoding and decoding) include data segmenting information (e.g., how many segments data (e.g., a file, a group of files, a data block, etc.) is divided into), segment security information (e.g., per segment encryption, compression, integrity checksum, etc.), error coding information (e.g., pillar/IDA width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

Each slice name is unique to a corresponding encoded data slice and includes multiple fields associated with the overall namespace of the DSN. For example, the fields may include a pillar number/pillar index, a vault identifier, an object number uniquely associated with a particular file for storage, and a data segment identifier of a plurality of data segments, where the particular file is divided into the plurality of data segments. For example, each slice name of a set of slice names corresponding to a set of encoded data slices that has been dispersed storage error encoded from a common data segment varies only by entries of the pillar number field as each share a common vault identifier, a common object number, and a common data segment identifier.

To support distributed task processing on received data, the distributed computing system 10 has two primary operations: DST (distributed storage and/or task processing) management and DST execution on received data. With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. With respect to the DST management, it is substantially similar to the DST management to support distributed task processing on received data.

Figure 2:
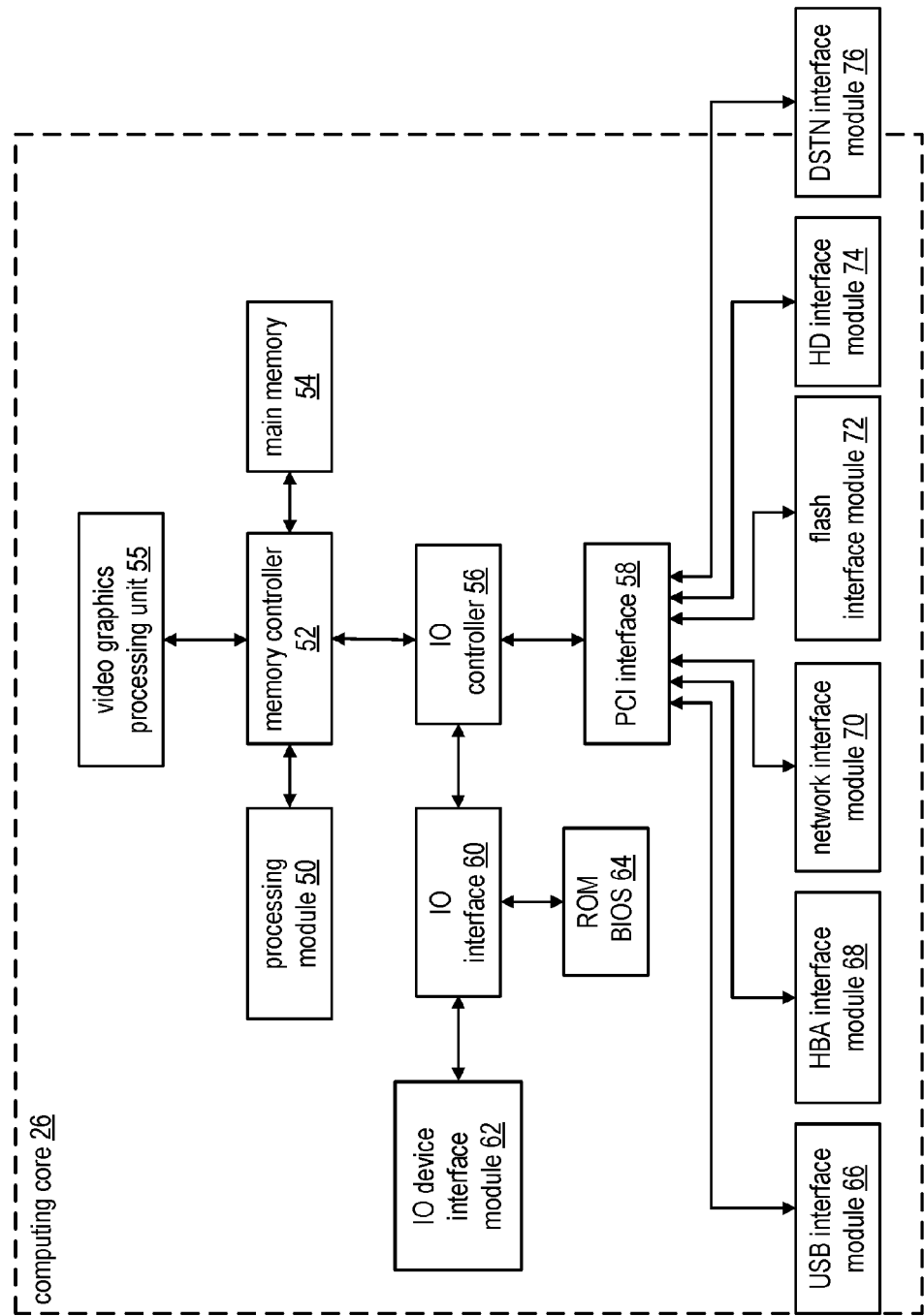
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
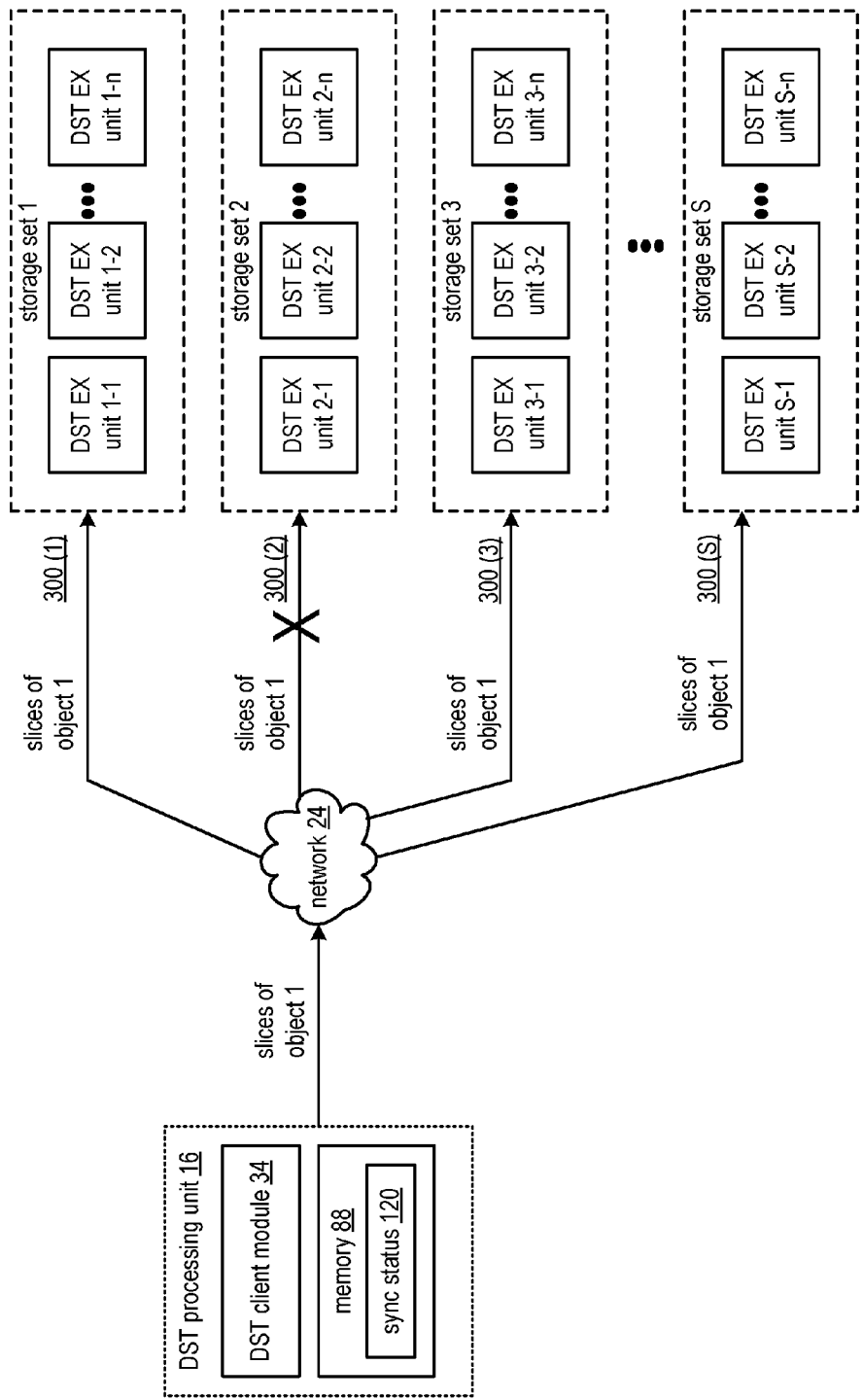
FIGS. 3-5 are schematic block diagrams of an embodiment of a dispersed storage network (DSN) in accordance with the present invention.
Figure 4:
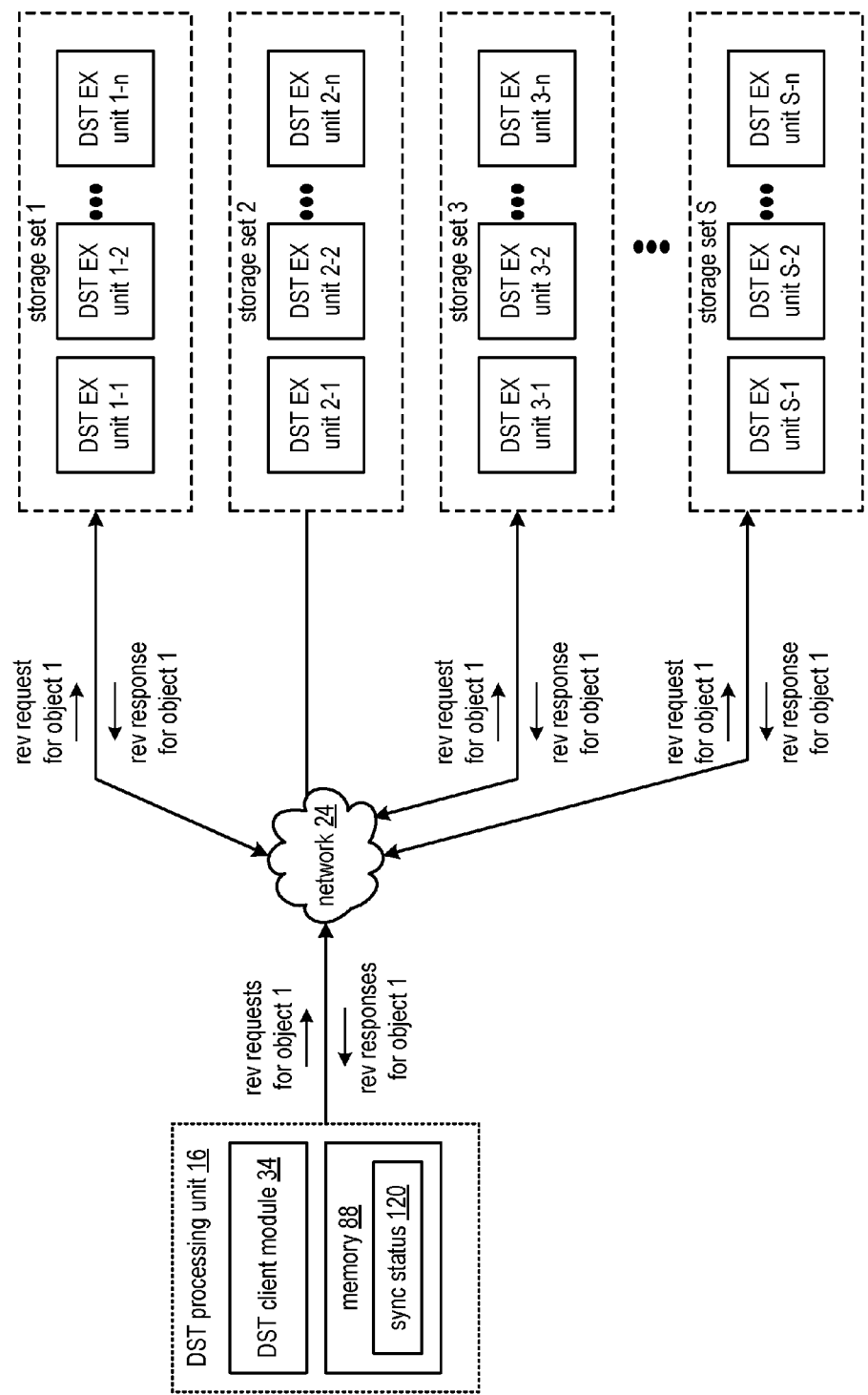
Figure 5:
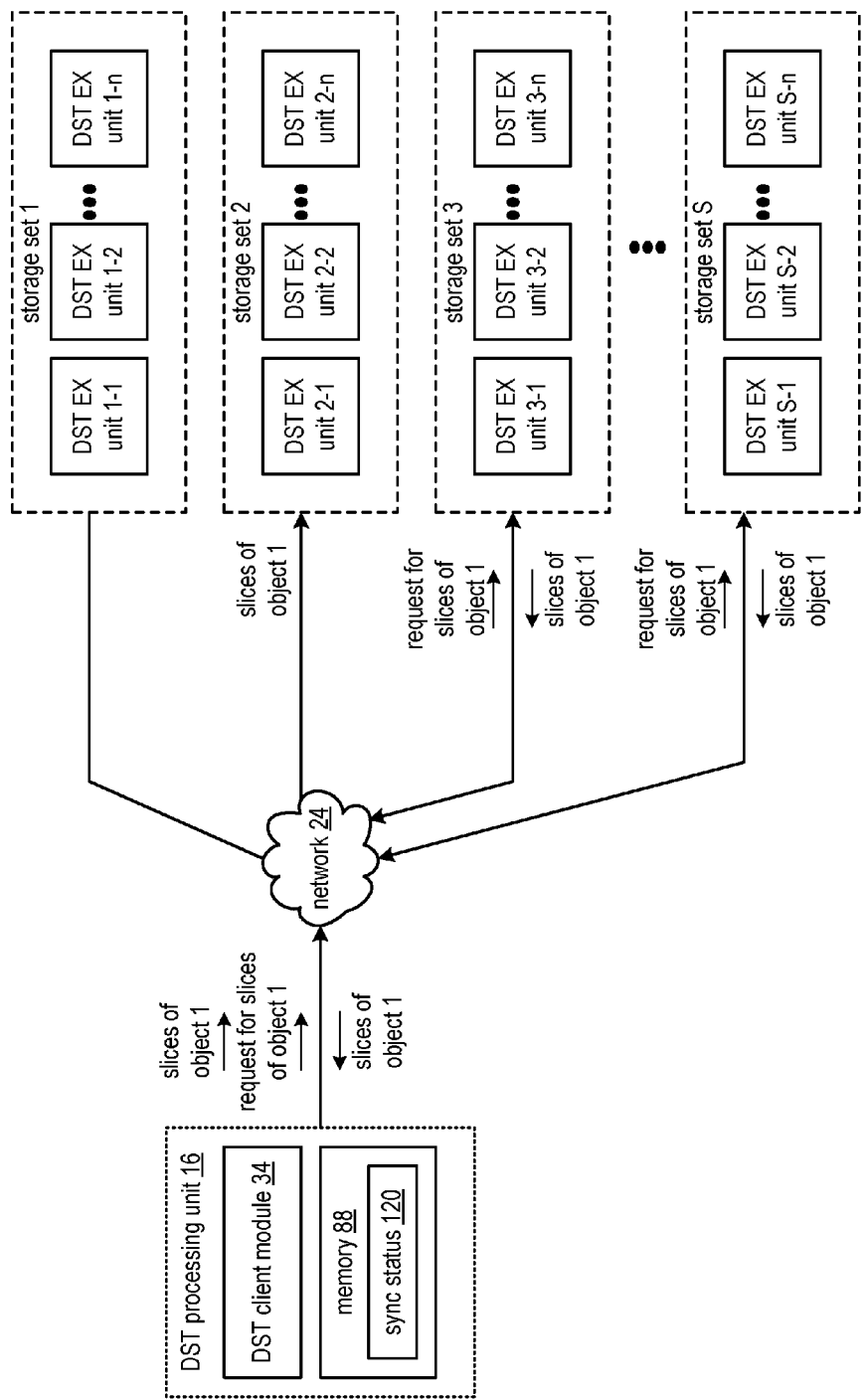

FIGS. 3-5 are schematic block diagrams of an embodiment of a dispersed storage network (DSN) that includes synchronizing replication of stored data as will be described in greater detail hereafter.

Two or more vaults (or DSN memories) may be arranged in a "mirror configuration", such that any object written to one vault will eventually be mirrored in the other vault and vice-versa. When everything is functioning normally, the ds processing unit, upon receiving a write request, takes responsibility for writing both instances to all locations comprising the mirror. For example, when vaults v1, and v2 are configured in a mirror, then when object "foo" is written through a ds processing unit to either v1 or v2, then the ds processing unit will attempt to write object "foo" to both vaults v1 and v2. However, there may be cases when not everything is functioning normally. The ds units supporting v2 may be at a remote location and suffer temporary availability outages. In such a case, ds processing units cannot write objects to all locations, but perhaps only a subset of the vaults that comprise the mirror configuration. In such cases, eventual recovery may be ensured by periodically listing slices/sources for object metadata against all sets of devices supporting the storage of each vault, and verifying that the same objects are found among all sets of vaults.

When a vault has at least one object that is not present in one of the other vaults, or of a higher revision number than others, then that object is "synchronized" with the other vaults that don't have it by reading it from the vault containing the highest revision of that object and writing it to the other vaults that are missing it or do not contain any revision of it. However, listing in this manner may be prohibitively expensive to complete on a regular basis, and may also be time consuming which delays the eventual synchronization of the data.

FIG. 3 is a schematic block diagram of another embodiment of a dispersed storage network (DSN) that includes the distributed storage and task (DST) processing unit 16 of FIG. 1, the network 24 of FIG. 1, and a plurality of storage sets 1-S. The DST processing unit 16 includes a memory 88 and the DST client module 34 of FIG. 1. The memory 88 may be implemented utilizing one or more of solid-state memory, magnetic disk drive memory, optical disk drive memory, etc. Each storage set includes a set of DST execution (EX) units 1-n. Each DST execution unit may be implemented utilizing the DST execution unit 36 of FIG. 1. Hereafter, each DST execution unit may be interchangeably referred to as a storage unit and each storage set may be interchangeably referred to as a set of storage units. The DSN functions to synchronize replication of stored data amongst a plurality of storage facilities.

FIG. 3 further illustrates an example of operation of the synchronizing of the replication of the stored data where the DST client module 34 initiates storage of a data object in two or more storage sets. For example, the DST client module 34 identifies the two or more storage sets (e.g., associated with a common vault, a common user, a common data object, etc.), dispersed storage error encodes a data object 1 to generate a plurality of sets of encoded data slices, and sends, via the network 24, the plurality of sets of encoded data slices as slices of the object 1 (300(1)-300(s)) to the identified two or more storage sets (e.g., all S storage sets).

Having initiated the storage of the data object, the DST client module 34 updates synchronization status 120 for the two or more storage sets when detecting failure to store at least a minimum number of encoded data slices to enable recovery in one of the storage sets. The synchronization status includes identities of data objects and revisions stored or not stored in each of the storage sets. For example, the DST client module 34 receives an indicator that storage of the plurality of sets of encoded data slices in the storage set 2 (300(2)) has failed, generates the updated synchronization status to include identity of the storage set 2 and identity of the data object 1, and stores the updated synchronization status in at least one of the memory 88 and in a dispersed hierarchical index structure within one or more of the storage sets.

FIG. 4 further illustrates the example of operation of the synchronizing of the replication of the stored data where the DST client module 34 determines to resynchronize the two or more storage sets. For example, the processing module determines to resynchronize in accordance with a synchronization schedule. As another example, the processing module determines to resynchronize when detecting availability of a previously unavailable storage set. Having determined to resynchronize, the DST client module 34 identifies a data object requiring resynchronization. For example, the DST client module 34 retrieves the synchronization status (e.g., from the memory 88 or from the dispersed hierarchical index structure), and selects an un-synchronized data object associated with a now-available storage set.

Having identified the data object requiring the resynchronization, the DST client module 34 determines a newest available revision associated with the data object. The determining includes one or more of issuing revision requests, interpreting received revision responses, and selecting a source storage set associated with a desired revision (e.g., a newest revision). For example, the DST client module 34 issues, via the network 24, revision requests for object 1 to each of the storage sets, receives, via the network 24, revision responses for object 1, and interprets the received revision responses to identify the newest available revision. For instance, the DST client module 34 determines that the newest available revision is stored at storage set 3.

FIG. 5 further illustrates the example of operation of the synchronizing of the replication of the stored data where the DST client module 34 determines to resynchronize the two or more storage sets. Having determined the newest available revision, the DST client module 34 facilitates storage of the identified newest available revision of the data object in at least one storage set requiring the newest revision to satisfy the re-synchronization. For example, the DST client module 34 issues, via the network 24, a request for slices of object 1 to the storage set 3, receives, via the network 24, slices of object 1 from the storage set 3, identifies the at least one storage set requiring the latest revision (e.g., storage set 2 is identified as out of synchronization)) and sends, via the network 24, the received slices of object 1 to the identified at least one storage set (e.g., to the storage set 2).

In an example embodiment, dispersed data structures, such as the Dispersed Concurrent Lockless Index (DLCI) or even sub-regions of other storage types in the vault, are used to store object write failures. When an object cannot be written to all vaults in a mirror by a ds processing unit, that ds processing unit writes an entry into the dispersed data structure indicating the name of the object that could not be fully synchronized, and optionally the time, and set of vaults which did succeed and/or those that did not succeed. From time to time, a synchronization process queries the dispersed data structure (e.g., traversing the DLCI, or listing the sub-region of the vault) to find entries of objects that were not fully synchronized. For example, by traversing the data structure in v1, the synchronization agent can find objects written to at least v1, but not to all other vaults in the mirror configuration to which v1 is a part.

The synchronization agent then reads the entry to determine the name of the object that was not fully synchronized and the latest revision of the object by checking the current revision of this object as it exists in other currently accessible vaults within the mirror. If not every vault is synchronized on this object, the synchronization agent reads the latest revision of this object from one of the vaults that contains the latest revision and then writes this revision of the object to every vault that does not have the latest revision. Upon successfully writing this revision of the object to all vaults, it verifies that all vaults now have the same and latest revision for this object. Upon successful verification, it removes this entry from the dispersed data structure.

Figure 6:
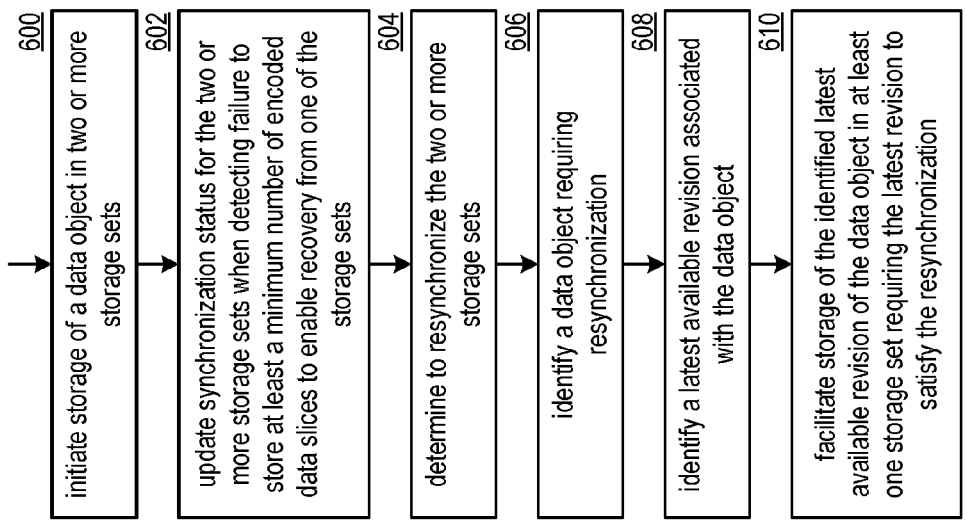
FIG. 6 is a flowchart illustrating an example of synchronizing replication of stored data amongst a plurality of storage facilities in accordance with the present invention.

FIG. 6 is a flowchart illustrating an example of synchronizing replication of stored data. In particular, a method is presented for use in conjunction with one or more functions and features described in conjunction with FIGS. 1-2, 3-5, and also FIG. 6.

The method begins at step 600, where a processing module (e.g., of a distributed storage and task (DST) client module) initiates storage of a data object in two or more storage sets of a plurality of storage sets. For example, the processing module identifies the two or more storage sets, generates a plurality of sets of encoded data slices, and sends the plurality of sets of encoded data slices to the identified two or more storage sets.

The method continues at the step 602, where the processing module updates synchronization status for the two or more storage sets when detecting failure to store at least a minimum number of encoded data slices to enable recovery from one of the storage sets. For example, the processing module generates the updated synchronization status to indicate an identity of the storage set and the data object, and stores the updated synchronization status in at least one of a local memory and a dispersed hierarchical index structure within one or more of the storage sets.

The method continues at step 604, where the processing module determines to resynchronize the two or more storage sets. The determining may be based on one or more of interpreting a synchronization schedule, a request, and detecting availability of a previously unavailable storage set.

The method continues at step 606, where the processing module identifies a data object requiring resynchronization. For example, the processing module retrieves the synchronization status, and selects and un-synchronized data object associated with a now-available storage set.

The method continues at step 608, where the processing module identifies a latest available revision associated with the data object. For example, the processing module issues revision requests to the plurality of storage sets, receives revision responses, and selects a source storage set associated with a desired revision (e.g., storing the latest revision of the data object).

The method continues at step 610, where the processing module facilitate storage of the identified latest available revision of the data object in at least one storage set requiring the latest revision to satisfy the resynchronization. For example, the processing module issues a request for encoded data slices of the latest revision of the data object from the source storage set, receives the encoded data slices of the latest revision of the data object, identifies the at least one storage set requiring the latest revision (e.g., based on revision responses), and sends the encoded data slices of the latest revision of the data object to the identified at least one storage set.

The method described above in conjunction with the computing device and the storage units can alternatively be performed by other modules of the dispersed storage network or by other devices. For example, any combination of a first module, a second module, a third module, a fourth module, etc. of the computing device and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions can, when executed by one or more processing modules of one or more computing devices and/or by the storage units of the dispersed storage network (DSN), cause the one or more computing devices and/or the storage units to perform any or all of the method steps described above.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by one or more processing modules of one or more computing devices of a dispersed storage network (DSN), the method comprises:
    initiating storage of a data object in two or more storage sets, wherein the data objects stored in each of the two or more storage sets are copies of each other, wherein the data object is segmented into a plurality of data segments, wherein each data segment of the plurality of data segments is dispersed error encoded in accordance with dispersed error encoding parameters to produce a set of encoded data slices (EDSs);
    detecting a failure to store at least a minimum number of EDSs of the data object in at least one of the two or more storage sets, wherein the minimum number of EDSs is a number required to enable recovery of the data object;
    initiating storage of an entry in the DSN, wherein the entry indicates the data object for which at least a minimum number of EDS failed to store;
    updating synchronization status for the data objects stored in each of the two or more storage sets, wherein the updating the synchronization status is includes querying the DSN for the entry for the data object;
    based on the updated synchronization status, determining to resynchronize the two or more storage sets;
    identifying a data object requiring resynchronization;
    identifying a latest available revision associated with the data object; and
    facilitating storage of the identified latest available revision of the data object in at least one storage set requiring the latest revision to satisfy the resynchronization.

2. The method of claim 1, wherein initiating storage includes: identifying the two or more storage sets, generating a plurality of sets of encoded data slices and sending the plurality of sets of encoded data slices to the identified two or more storage sets.

3. The method of claim 2, wherein the identified two or more storage sets are associated with common user.

4. The method of claim 2, wherein the updating includes any of: generating the updated synchronization status to indicate an identity of the storage set and the data object, storing the updated synchronization status in at least one of a local memory or storing a dispersed hierarchical index within one or more of the storage sets.

5. The method of claim 2, wherein the determining to resynchronize is in accordance with a schedule or when detecting availability of a previously unavailable storage set.

6. The method of claim 2, wherein the identifying a data object includes retrieving the synchronization status and selecting an un-synchronized data object associated with a now-available storage set.

7. The method of claim 2, wherein the identifying a latest available revision includes: issuing revision requests, receiving revision responses and selecting a source storage set associated with a desired revision.

8. The method of claim 7, wherein the latest revision is based on the revision responses.

9. The method of claim 2, wherein the initiating storage includes:
    issuing a request for slices of the latest revision of the data object from source storage set; receiving the slices of the latest revision of the data object; and identifying the at least one storage set requiring the latest revision and sending the slices of the latest revision of the data object to the identified at least one storage set.

10. A non-transitory computer readable storage medium comprises:
    at least one memory section that stores operational instructions that, when executed by one or more processing modules of one or more computing devices of a dispersed storage network (DSN), causes the one or more computing devices to:
        initiate storage of a data object in two or more storage sets, wherein the data objects stored in each of the two or more storage sets are copies of each other, wherein the data object is segmented into a plurality of data segments, wherein each data segment of the plurality of data segments is dispersed error encoded in accordance with dispersed error encoding parameters to produce a set of encoded data slices (EDSs);
        detect a failure to store at least a minimum number of EDSs from the data object in at least one of the two or more storage sets, wherein the minimum number of EDSs is a number required to enable recovery of the data object;

initiate storage of an entry in the DSN, wherein the entry indicates the data object for which at least a minimum number of EDS failed to store;

update synchronization status for the data objects stored in each of the two or more storage sets, wherein the updating the synchronization status is includes querying the DSN for the entry for the data object;

determine, based on the updated synchronization status, to resynchronize the two or more storage sets;

identify a data object requiring resynchronization;

identify a latest available revision associated with the data object; and facilitate storage of the identified latest available revision of the data object in at least one storage set requiring the latest revision to satisfy the resynchronization.

11. The non-transitory computer readable storage medium of claim 10 further comprises:

during initiating storage, identifying the two or more storage sets, generating a plurality of sets of encoded data slices and sending the plurality of sets of encoded data slices to the identified two or more storage sets.

12. The non-transitory computer readable storage medium of claim 10 further comprises:

the identified two or more storage sets being associated with a common user.

13. The non-transitory computer readable storage medium of claim 10 further comprises:

the updating synchronization status including any of: generating the updated synchronization status to indicate an identity of the storage set and the data object, storing the updated synchronization status in at least one of a local memory or storing a dispersed hierarchical index within one or more of the storage sets.

14. The non-transitory computer readable storage medium of claim 10 further comprises:

the determining to resynchronize the two or more storage sets being executed in accordance with a schedule or when detecting availability of a previously unavailable storage set.

15. The non-transitory computer readable storage medium of claim 10 further comprises:

the identifying a data object including retrieving the synchronization status and selecting an un-synchronized data object associated with a now-available storage set.

16. The non-transitory computer readable storage medium of claim 10 further comprises:

the identifying a latest available revision including: issuing revision requests, receiving revision responses and selecting a source storage set associated with a desired revision.

17. The non-transitory computer readable storage medium of claim 10 further comprises:

the facilitating storage including: issuing a request for slices of the latest revision of the data object from source storage set, receiving the slices of the latest revision of the data object, identifying the at least one storage set requiring the latest revision and sending the slices of the latest revision of the data object to the identified at least one storage set.

18. A computing device of a group of computing devices of a dispersed storage network (DSN), the computing device comprises:

an interface;

a local memory; and a processing module operably coupled to the interface and the local memory, wherein the processing module functions to:

initiate storage of a data object in two or more storage sets, wherein the data objects stored in each of the two or more storage sets are copies of each other, wherein the data object is segmented into a plurality of data segments, wherein each data segment of the plurality of data segments is dispersed error encoded in accordance with dispersed error encoding parameters to produce a set of encoded data slices (EDSs), wherein each storage set of the two or more storage sets is associated with a vault;

detect a failure to store at least a minimum number of EDSs from the data object in at least one of the two or more storage sets, wherein the minimum number of EDSs is a number required to enable recovery of the data object;

initiate storage of an entry in the DSN, wherein the entry indicates the data object for which at least a minimum number of EDS failed to store;

update synchronization status for the data objects stored in each of the two or more storage sets, wherein the updating the synchronization status is includes querying the DSN for the entry for the data object;

determine, based on the updated synchronization status, to resynchronize the two or more storage sets;

identify a data object requiring resynchronization;

identify a latest available revision associated with the data object; and facilitate storage of the identified latest available revision of the data object in at least one storage set requiring the latest revision to satisfy the resynchronization.

19. The computing device of claim 18, wherein the processing module further functions to:

generate the updated synchronization status to indicate an identity of the storage set and the data object, storing the updated synchronization status in at least one of a local memory or storing a dispersed hierarchical index within one or more of the storage sets.

20. The computing device of claim 18, wherein the processing module further functions to:

determining to resynchronize in accordance with a schedule or when detecting availability of a previously unavailable storage set.

* * * * *